(12) United States Patent
Forsyth

(10) Patent No.: US 6,988,621 B2
(45) Date of Patent: Jan. 24, 2006

(54) REDUCED MOVEMENT WAFER BOX

(75) Inventor: Valoris L. Forsyth, Lewisville, TX (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/787,489

(22) Filed: Feb. 25, 2004

(65) Prior Publication Data

US 2004/0256285 A1    Dec. 23, 2004

Related U.S. Application Data

(60) Provisional application No. 60/479,086, filed on Jun. 17, 2003.

(51) Int. Cl.
    *B65D 85/30*    (2006.01)
(52) U.S. Cl. .................................... 206/710
(58) Field of Classification Search ............... 206/445, 206/454, 710–712, 307, 307.1, 308, 308.1, 206/832, 449, 453, 455, 456; 220/324, 326, 220/8; 211/41.12, 41.18; 312/9.9, 9.64, 312/9.2, 9.8
    See application file for complete search history.

(56) References Cited

U.S. PATENT DOCUMENTS

| | | | | |
|---|---|---|---|---|
| 3,691,294 A | * | 9/1972 | Charles | ........................ 178/46 |
| 3,997,072 A | * | 12/1976 | Guth | ........................... 220/324 |
| 5,366,079 A | * | 11/1994 | Lin et al. | ..................... 206/710 |
| 5,553,711 A | * | 9/1996 | Lin et al. | ..................... 206/710 |
| 5,611,448 A | * | 3/1997 | Chen | ........................... 220/4.27 |
| 5,725,100 A | * | 3/1998 | Yamada | ..................... 206/710 |
| 6,193,090 B1 | * | 2/2001 | Connors et al. | ........... 220/4.24 |
| 6,341,695 B1 | * | 1/2002 | Lewis et al. | ................. 206/710 |

* cited by examiner

*Primary Examiner*—Mickey Yu
*Assistant Examiner*—J. Gregory Pickett
(74) *Attorney, Agent, or Firm*—Pitney Hardin LLP

(57) ABSTRACT

The semiconductor wafer containment device or wafer box includes a base with a planar floor and a cylindrical wall arising therefrom. A double concentric wall structure includes slots which receive body chip wafer pins which extend into the space formed between the inner cylindrical wall and the wafer so as to cushion the semiconductor wafers and prevent movement of the semiconductor wafers during transportation. Alternately, a single cylindrical wall includes slots which receive extruded finned pins which include fins which extend inward into the space formed within the cylindrical wall so as to cushion the semiconductor wafers and prevent movement of the semiconductor wafers during transportation. The semiconductor wafer containment device or wafer box further includes a lid which is engaged by the base thereby capturing the extruded finned pins during transportation.

20 Claims, 14 Drawing Sheets

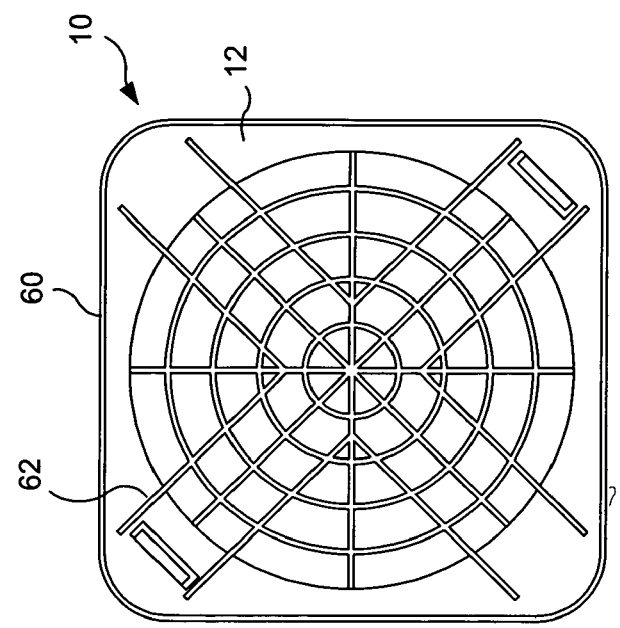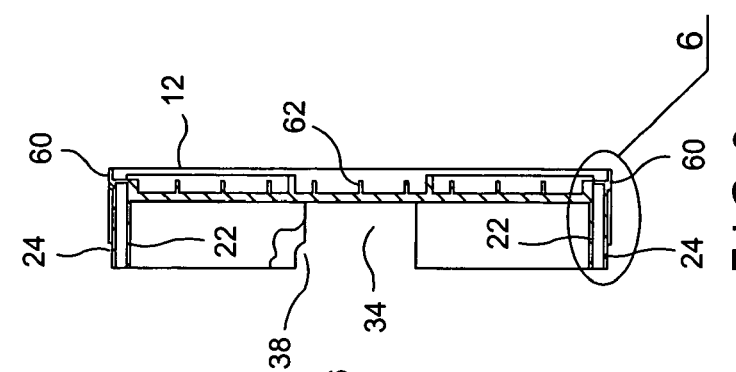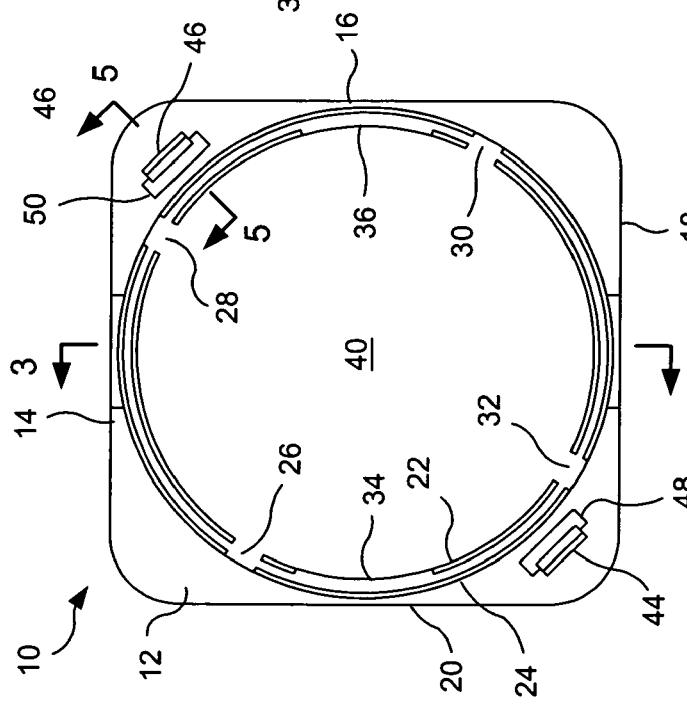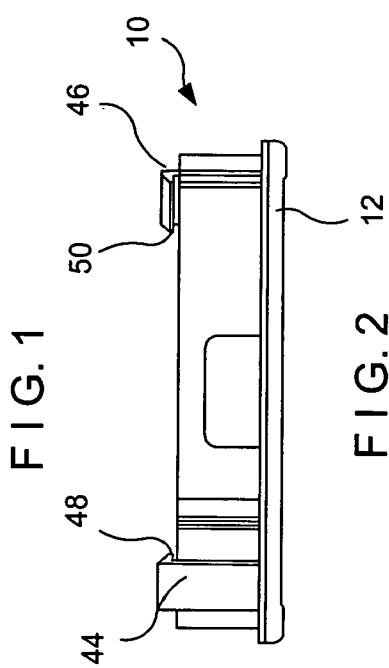

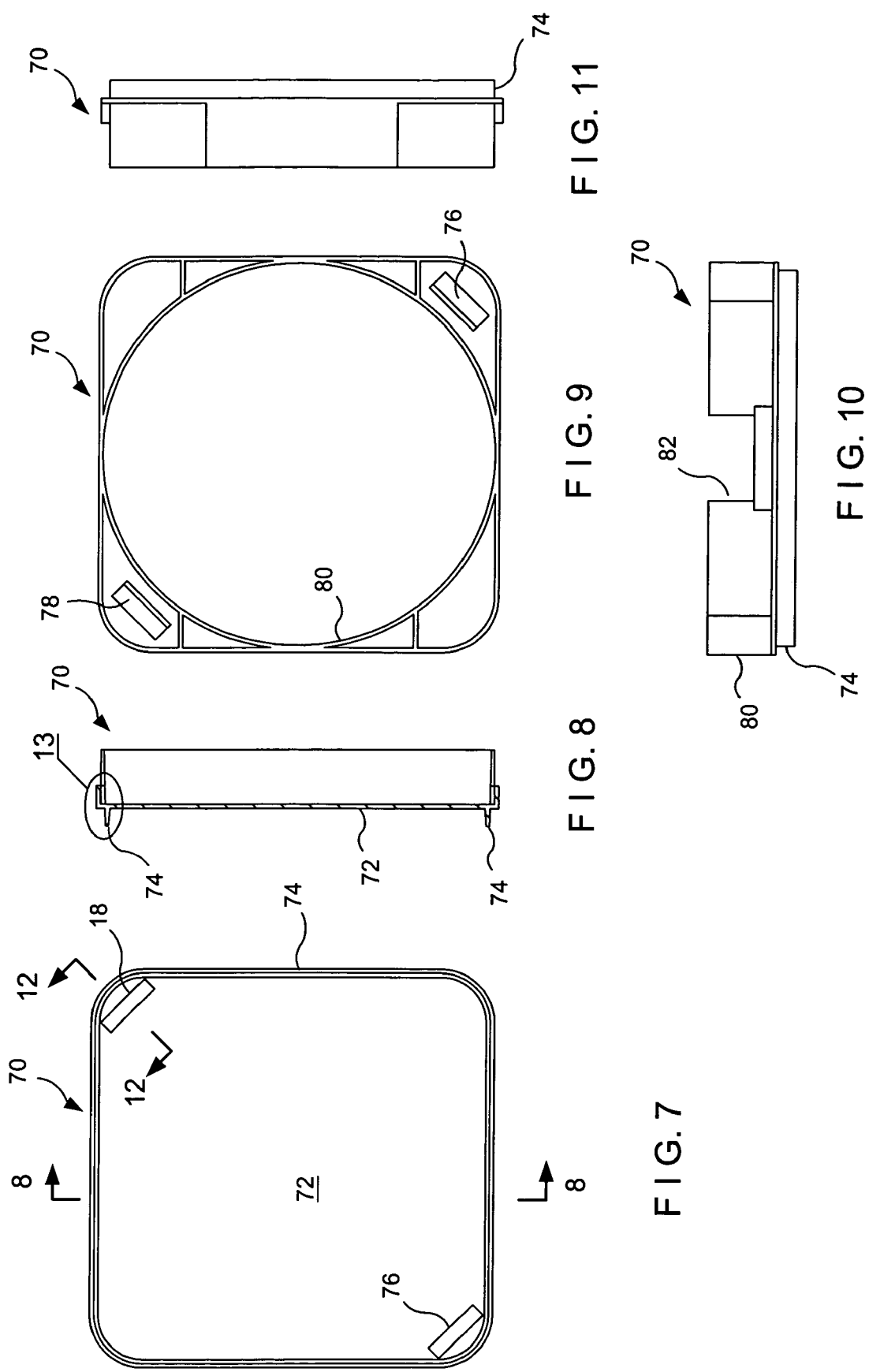

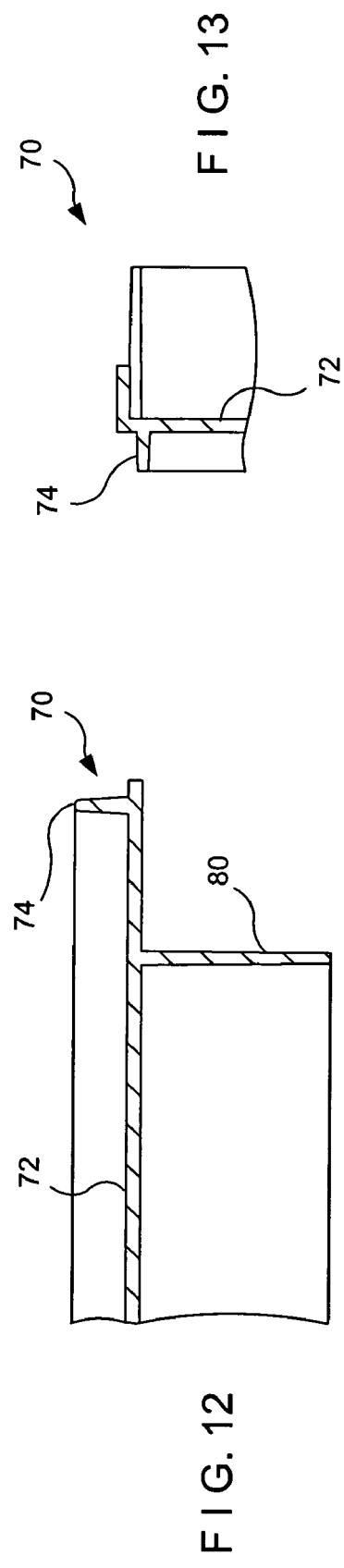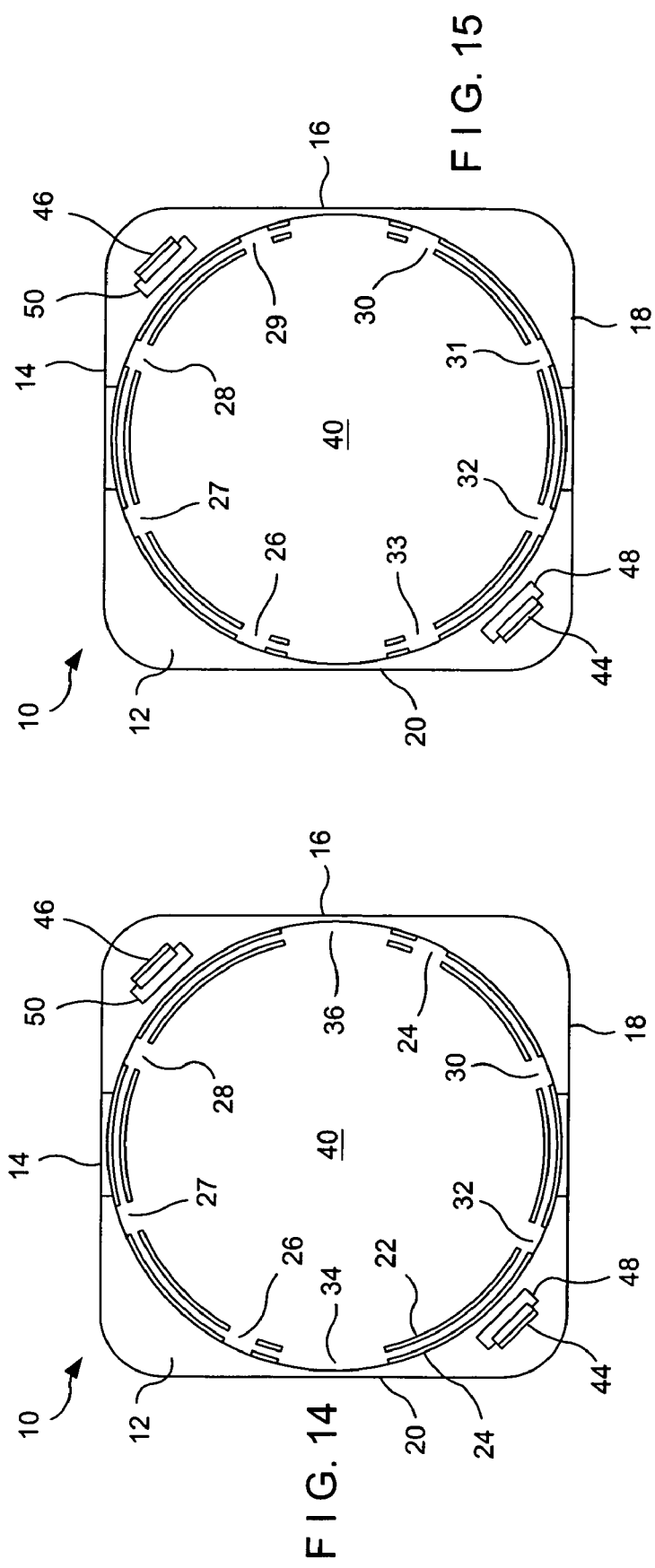

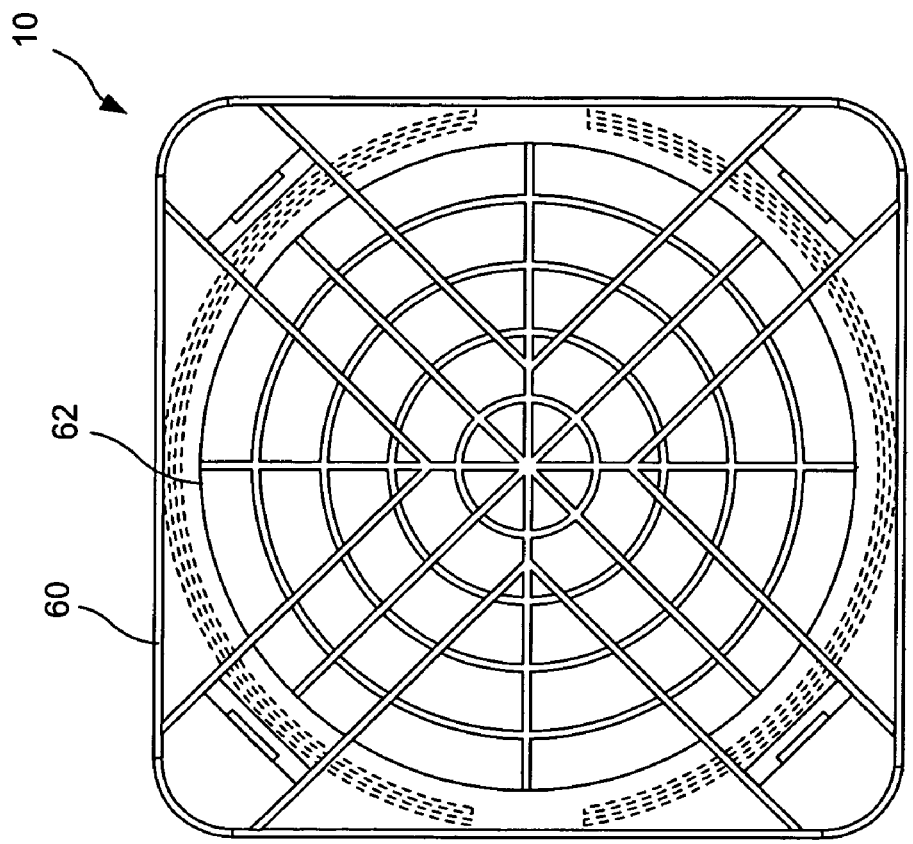
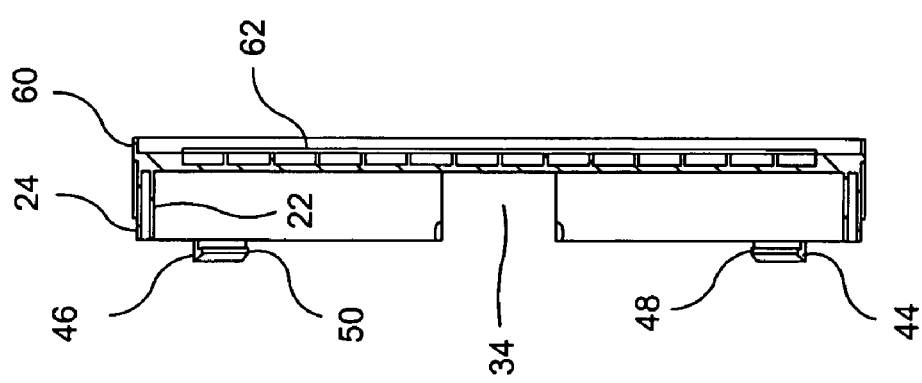

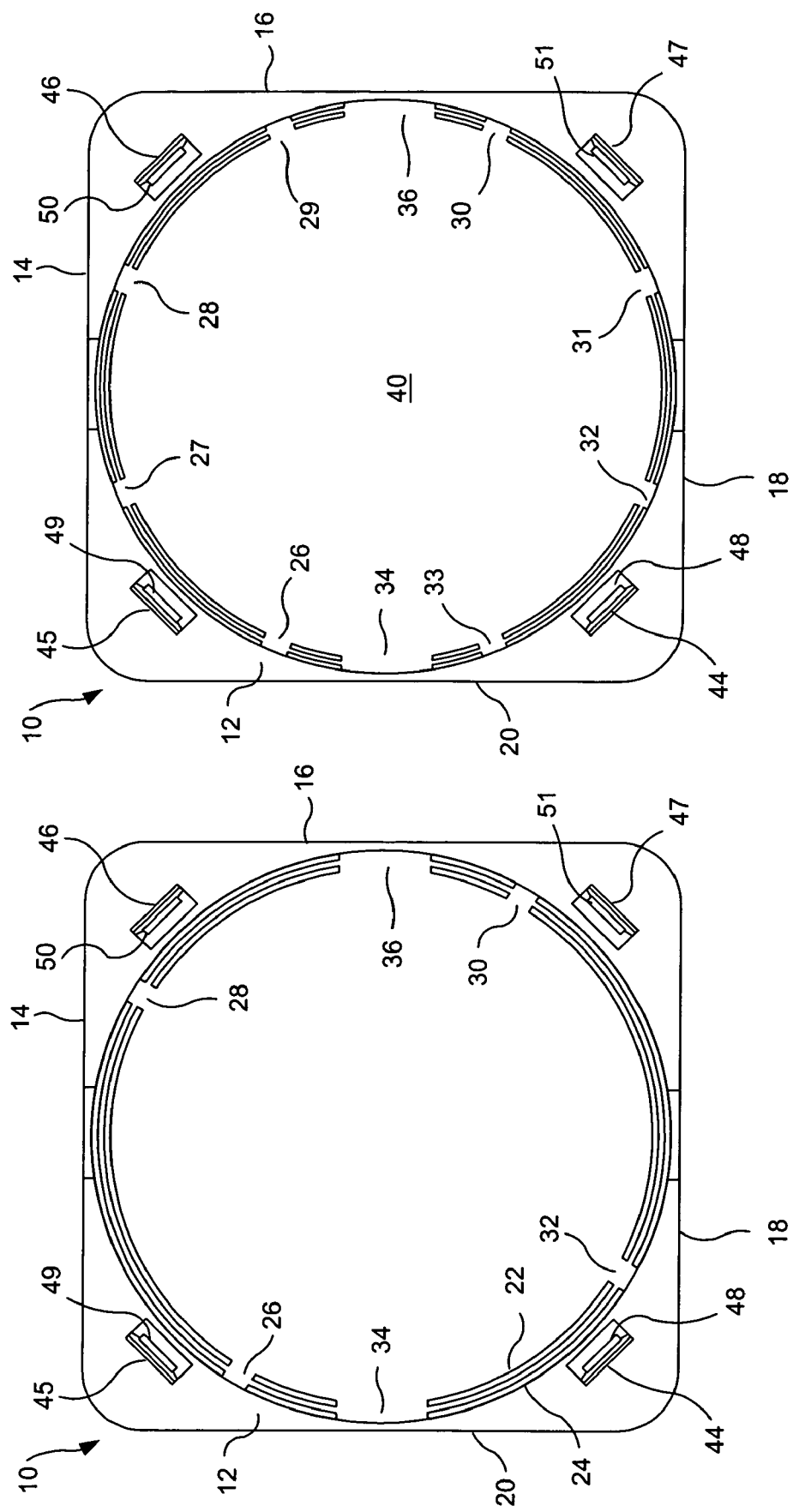

REDUCED MOVEMENT WAFER BOX

This utility application claims priority from provisional U.S. patent Ser. No. 60/479,086 filed Jun. 17, 2003.

BACKGROUND OF THE INVENTION

1. Field of the Invention

The present invention relates to a containment device or wafer box for semiconductor wafers. More particularly, this containment device has a wall with slots which receive extruded body chip wafer fins or finned pins which are inserted after the semiconductor wafers in order to cushion the wafers during transport. The body chip wafer fins or extruded finned pins are removed prior to automated unloading of the semiconductor wafers from the containment device.

2. Description of the Prior Art

The prior art contains a variety of designs for the containment and transport of semiconductor wafers. These designs must provide both electrostatic and mechanical protection for the wafers contained therein. Preferably, such containment devices should be easily adaptable to various automated apparatus which load or unload the semiconductor wafers. Such containment devices should have a simple design which is reliable and economical to mass produce. Moreover, it would be advantageous for any advances in the art of semiconductor wafer containment to be retrofitted into existing semiconductor wafer containment devices.

Examples of some prior art are U.S. Pat. No. 6,193,068 entitled "Containment Device for Retaining Semiconductor Wafers" issued on Feb. 27, 2001 to Lewis et al.; U.S. Pat. No. 6,286,684 entitled "Protective System for Integrated Circuit (IC) Wafers Retained Within Containers Designed for Storage and Shipment" issued on Sep. 11, 2001 to Brooks et al.; U.S. Pat. No. 6,003,674 entitled "Method and Apparatus for Packing Contaminant-Sensitive Articles and Resulting Package" issued on Dec. 21, 1999 to Brooks; and U.S. Pat. No. 5,724,748 entitled "Apparatus for Packaging Contaminant-Sensitive Articles and Resulting Package" issued on Mar. 10, 1998 to Brooks et al.

OBJECTS AND SUMMARY OF THE INVENTION

In order to attain the above and other objects, the cylindrical wall of a semiconductor wafer containment device is provided with slots. These slots receive extruded body chip wafer fins or finned pins after the loading of the semiconductor wafers. The lid of the containment device captures the extruded finned pins in place for transport. The extruded body chip wafer fins or finned pins are removed prior to unloading of the wafers by robotics or similar methods. The extruded body chip wafer fins or finned pins are designed to reduce the space in the base box and to engage the semiconductor wafers firmly so that the semiconductor wafers do not move within the containment device. The body chip wafer fins or finned pins are rigid enough to take up the required space but flexible enough to allow accidental side wall impact without breaking the wafers. The fins or pins could be placed around the entire periphery of the cylindrical walls or around half of the periphery of the cylindrical walls.

BRIEF DESCRIPTION OF THE DRAWINGS

Further objects and advantages will become apparent from the following description and from the accompanying drawings, wherein:

FIG. 1 is a top plan view of the base of a first embodiment of the semiconductor wafer containment device of the present invention, with a double wall configuration and four slots for engaging the body chip wafer fins.

FIG. 2 is a side plan view of the base of the first embodiment of the semiconductor wafer containment device of the present invention.

FIG. 3 is a cross-sectional view along plane 3—3 of FIG. 1.

FIG. 4 is a bottom plan view of the base of the first embodiment of the semiconductor wafer containment device of the present invention.

FIG. 7 is a top plan view of the lid for the first embodiment, and typical of the lids of other embodiments, of the semiconductor wafer containment device of the present invention.

FIG. 8 is a cross-sectional view along plane 8—8 of FIG. 7.

FIG. 9 is a bottom plan view of the lid of FIG. 7.

FIG. 10 is a front plan view of the lid of FIG. 7.

FIG. 11 is a side plan view of the lid of FIG. 7.

FIG. 12 is a cross-sectional view along plane 12—12 of FIG. 7.

FIG. 13 is a cross-sectional view further detailing a portion of FIG. 8.

FIG. 14 is a top plan view of the base of a second embodiment of the semiconductor wafer containment device of the present invention, with a double wall configuration and six slots for engaging the body chip wafer fins.

FIG. 15 is a top plan view of the base of a third embodiment of the semiconductor wafer containment device of the present invention, with a double wall configuration and eight slots for engaging the body chip wafer fins.

FIG. 18 is a cross-sectional view along plane 18—18 of FIG. 16.

FIG. 19 is a bottom plan view of the base of the fourth embodiment of the semiconductor wafer containment device of the present invention.

FIG. 20 is a top plan view of the base of the fifth embodiment of the semiconductor wafer containment device of the present invention, which is typically the same size as the fourth embodiment, but with four slots for engaging the body chip wafer fins.

FIG. 21 is a top plan view of the base of the sixth embodiment of the semiconductor wafer containment device of the present invention, which is typically the same size as the fourth and fifth embodiments, but with eight slots for engaging the body chip wafer fins.

DETAILED DESCRIPTION OF THE PREFERRED EMBODIMENT

Figure 6:
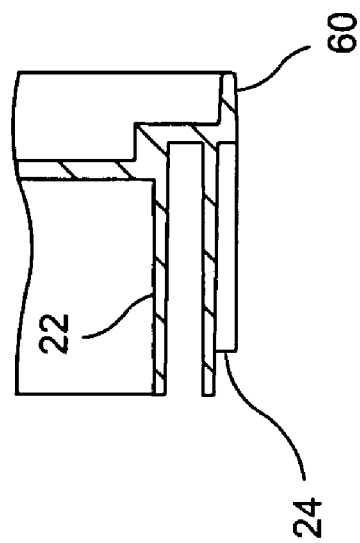
FIG. 6 is a cross-sectional view further detailing a portion of FIG. 3.
Figure 5:
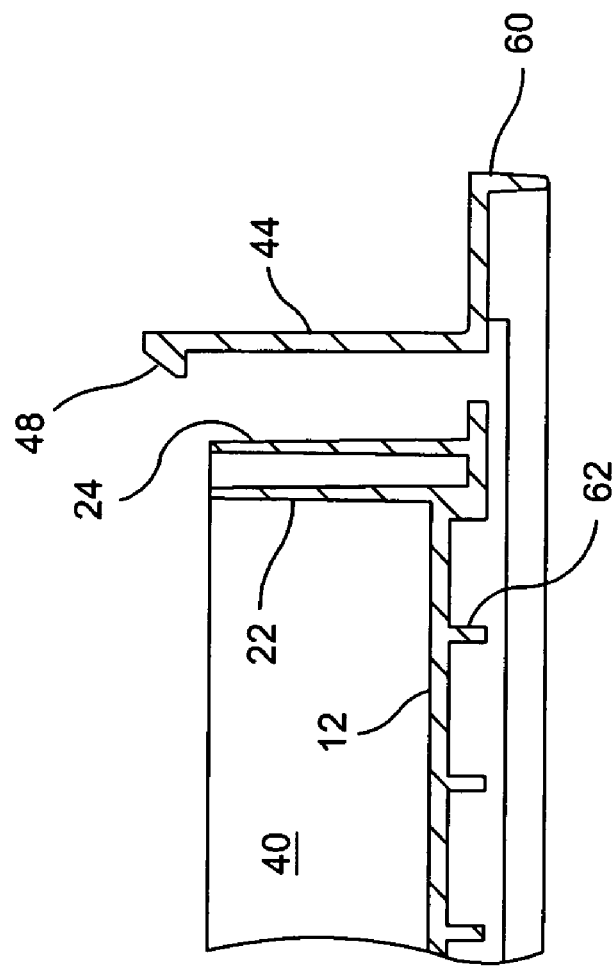
FIG. 5 is a cross-sectional view along plane 5—5 of FIG. 1.
Figure 16:
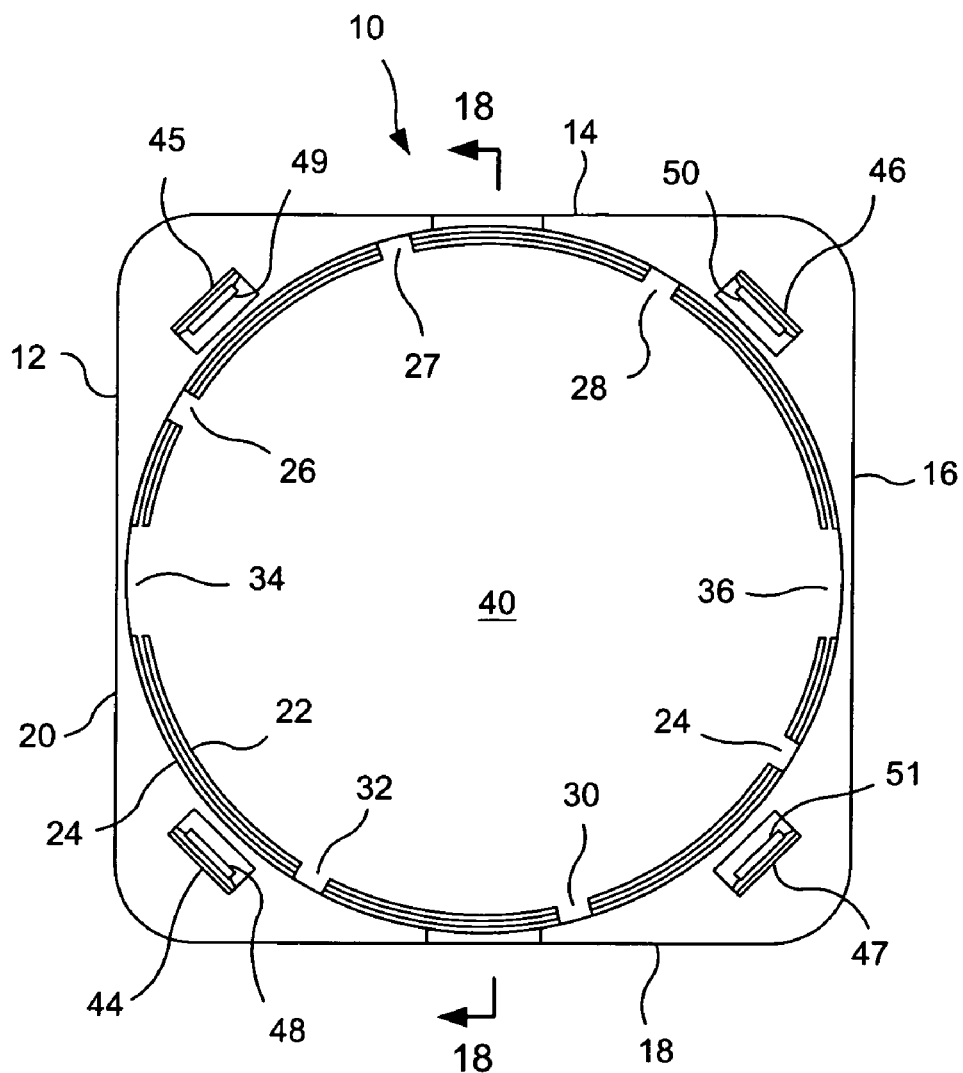
FIG. 16 is a top plan view of the base of a fourth embodiment of the semiconductor wafer containment device of the present invention, which is typically larger than the first, second and third embodiments, with a double wall configuration and six slots for engaging the body chip wafer fins.
Figure 17:
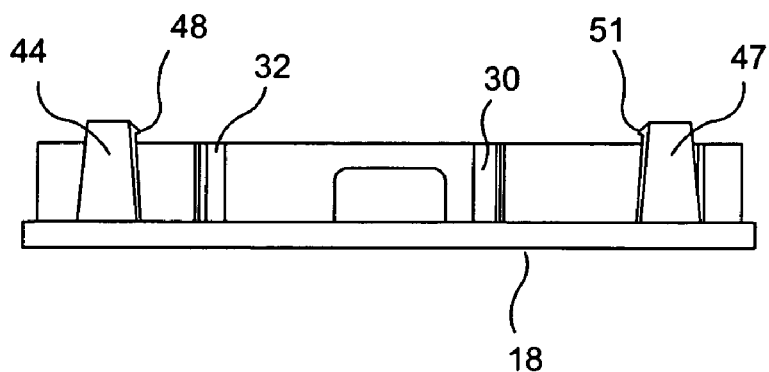
FIG. 17 is a side plan view of the base of the fourth embodiment of the semiconductor wafer containment device of the present invention.

Referring now to the drawings in detail wherein like numerals refer to like elements throughout the several views, one sees that FIG. 1 is a top plan view of a first embodiment of the base 10 of the semiconductor wafer containment device or wafer box of the present invention. Base 10 includes a generally planar square floor 12 formed from sides 14, 16, 18, 20. Inner and outer concentric segmented cylindrical walls 22, 24 rise from the planar floor. Inner and outer concentric segmented cylindrical walls 22, 24 include relatively smaller aligned gaps thereby forming slots 26, 28, 30, 32 at ninety degree intervals about the periphery of walls 22, 24. Similarly, inner and outer concentric segmented cylindrical walls 22, 24 include relatively larger aligned gaps thereby forming openings 34, 36 which are opposed by 180° from each other about the periphery of walls 22, 24. As shown in the fragmentary portion of FIG. 3, the portion of inner concentric segmented cylindrical wall 22 immediately adjacent to openings 34, 36 includes partial notch 38. A wafer containment area 40 is formed within inner concentric segmented cylindrical wall 22. In this embodiment, wafer containment area 40 may be adapted to an eight inch diameter wafer, although a range of other sizes is certainly possible. Clips 44, 46 terminating in inverted ledges 48, 50 arise from a pair of diagonally opposite corners of floor 12.

FIG. 4 shows the bottom plan view of base 10, including peripheral foot structure 60 which extends around the periphery of floor 12 in order to provide an offset between floor 12 and the surface (not shown) upon which base 10 is resting. Additionally, lattice work 62 is formed on the bottom of floor 12.

FIGS. 7–13 show the lid 70 which is adaptable to the various disclosed embodiments of the semiconductor wafer containment device or wafer box of the present invention. Lid 70 includes top planar rectangular surface 72 surrounded by peripheral upwardly extending ledge 74. Slots 76, 78 are formed on opposite corners of top planar rectangular surface 72. In the installed position, slots 76, 78 receive clips 44, 46 to form a detent configuration. Outer cylindrical wall 80 is formed on the lower side of top planar rectangular surface 72. Outer cylindrical wall 80 further includes openings 82 which are oriented 180° apart. In the installed position, outer cylindrical wall 80 is immediately outwardly concentrically adjacent from outer concentric segmented cylindrical wall 24. A similar lid is disclosed in U.S. Pat. No. 6,193,068, entitled "Containment Device for Retaining Semiconductor Wafers", the contents of which are hereby incorporated by reference.

FIGS. 14 discloses a second embodiment of the base 10 of the semiconductor wafer containment device or wafer box of the present invention. This embodiment is very similar to that disclosed in FIGS. 1–6 except that six slots 26, 27, 28, 29, 30, 32 are formed about the periphery of walls 22, 24. The intervals between slots 26 and 27, between slots 27 and 28, between slots 29 and 30, and between slots 30 and 32 are approximately 45° whereas the intervals between slots 26 and 32 and between slots 28 and 29 are approximately 90°, wherein these 90° intervals include gaps 34 and 36, respectively. In this embodiment, wafer containment area 40 may be adapted to an eight inch diameter wafer, although a range of other sizes is certainly possible.

FIG. 15 discloses a third embodiment of the base 10 of the semiconductor wafer containment device or wafer box of the present invention eight slots 26, 27, 28, 29, 30, 31, 32, 33 are formed about the periphery of walls 22, 24 and the interval between any two successive slots is 45°. In this embodiment, wafer containment area 40 may be adapted to an eight inch diameter wafer, although a range of other sizes is certainly possible.

FIGS. 16–19 disclose a fourth embodiment of base 10 of the semiconductor wafer containment device or wafer box of the present invention. This fourth embodiment is adapted to larger wafer sizes than are the previous embodiments, typically a twelve inch diameter wafer can be held in the wafer containment area, although a range of other sizes is certainly possible. As the base 10 of this embodiment is larger than the base 10 of previous embodiments, additional clips 45, 47 with respective inverted ledges 49, 51 are provided so that clips 44, 45, 46, 47 are provided at each of the four corners of base 10. The lid 70 corresponding to this base 10, of course, would have compatible dimensions and include four slots similar to slots 76, 78 shown in FIGS. 7 and 9 for the engagement of clips 44, 45, 46, 47.

FIGS. 20 and 21 disclose fifth and sixth embodiments, respectively, of base 10 of the semiconductor wafer containment device or wafer box of the present invention. The fifth and sixth embodiments are similar to the fourth embodiment of base 10, except that FIG. 20 discloses four slots 26, 28, 30, 32 spaced at 90° intervals about the periphery of walls 22, 24 whereas FIG. 21 discloses eight slots 26, 27, 28, 29, 30, 31, 32, 33 spaced at 45° intervals about the periphery of walls 22, 24.

Figure 23:
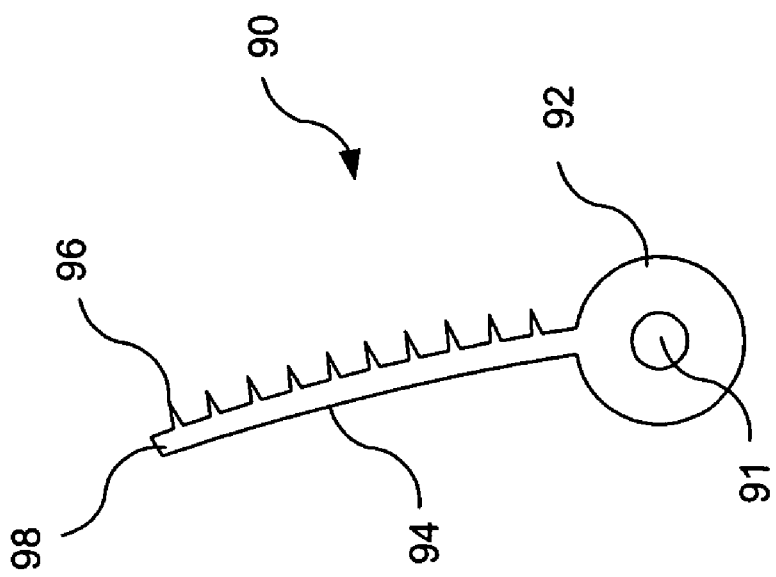
FIG. 23 is an end elevational view of the body chip wafer fin of the present invention.
Figure 22:
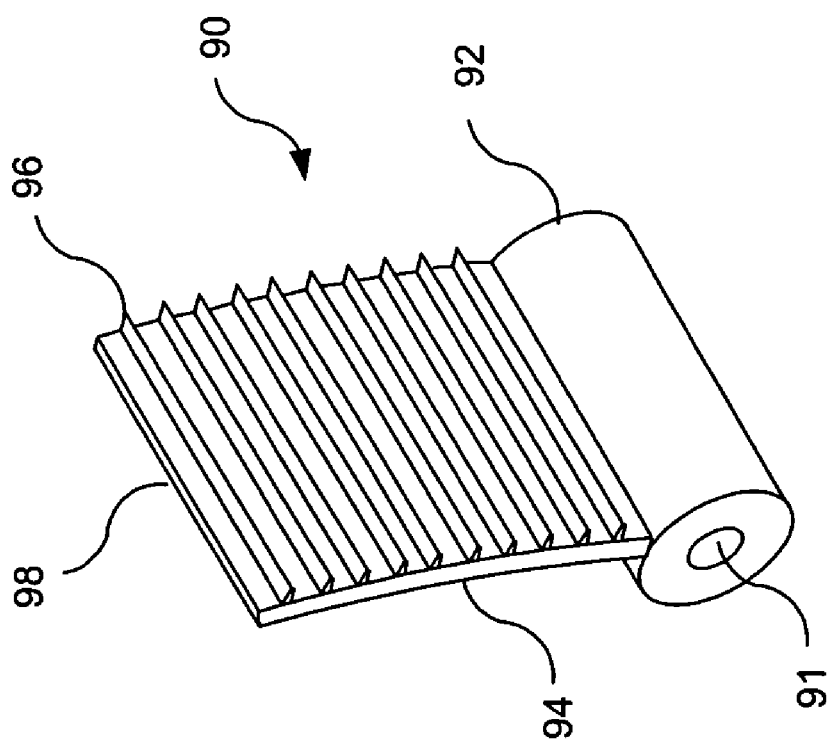
FIG. 22 is a perspective view of the body chip wafer fin of the present invention.

FIGS. 22 and 23 are perspective and end elevational views, respectively, of the body chip wafer pin 90 which is used with the first through sixth embodiments of the semiconductor wafer containment device or wafer box described above. Body chip wafer pin 90 includes cylindrical head 92 which is configured to have a large enough diameter so that it will not pass through any of slots 26–33. Central longitudinal aperture 91 passes through head 91. Body chip wafer pin 90 further includes tail 94 extending from head 90, and including a series of teeth 96 formed along the width thereof and extending perpendicularly from tail 94.

In order to form a secure but elastic configuration engaging the wafer chips (not shown) within wafer containment area 40, the wafers (typically eight or twelve inches in diameter, but other diameters are completely adaptable to the present design) are placed in wafer containment area 40. There is some gap between the inner concentric segmented cylindrical wall 22 and the outer periphery of the wafer. In order to fill this gap, body chip wafer pins 90 are placed into slots 26–33 so that head 92 is outwardly adjacent from outer concentric segmented cylindrical wall 24 and tail 94 passes through the respective slot with the distal end 98 passing back through the respective slot thereby abutting head 92 and forming a loop which elastically urges against the wafer chip. Alternatively, head 92 can be placed inwardly of inner wall 22 so that head 92 partially nests within slots 26–33 and tail 94 extends outwardly through slots 26–33 and serves as a gripping section to remove the body chip wafer pin 90 at the appropriate time.

Figure 29:
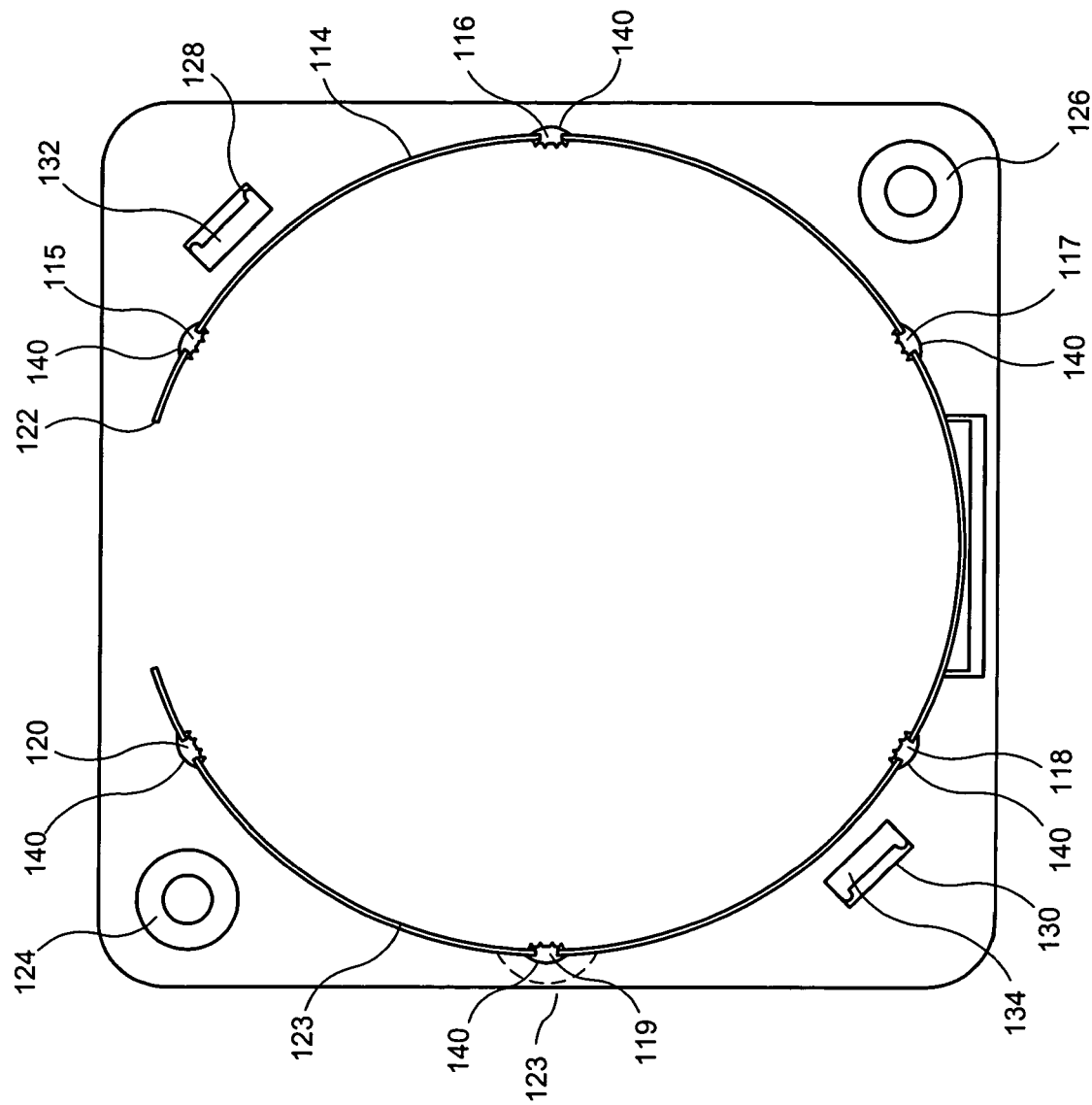
FIG. 29 is a top plan view of the base of the seventh embodiment of the semiconductor wafer containment device of the present invention, shown with the extruded finned pins inserted. Additionally, a single optional shielding wall is shown in phantom in this figure.

One sees that FIGS. 24–29 show the base 110 of the seventh embodiment of the semiconductor wafer containment device or wafer box. Base 110 includes a generally planar square floor 112 from which cylindrical wall 114 arises. A single cylindrical wall 114 is disclosed in the drawings, but some applications may require two concentric cylindrical walls 14 in order to further reduce the possibility of contamination. Cylindrical wall 114 includes six slots 115, 116, 117, 118, 119, 120 about the periphery thereof and further includes an opening 122. Further, optional shielding walls could be formed outwardly around each slot 115, 116, 117, 118, 119, 120 to reduce the possibility of contamination. FIG. 29 shows, in phantom, a single optional shielding wall 123 formed outwardly around slot 119.

Cylindrical stabilizing devices 124, 126 arise from a first pair of opposing corners of floor 112, while clips 128, 130 terminating in inverted ledges 132, 134 arise from a second pair of opposing corners of floor 112.

Figure 30:
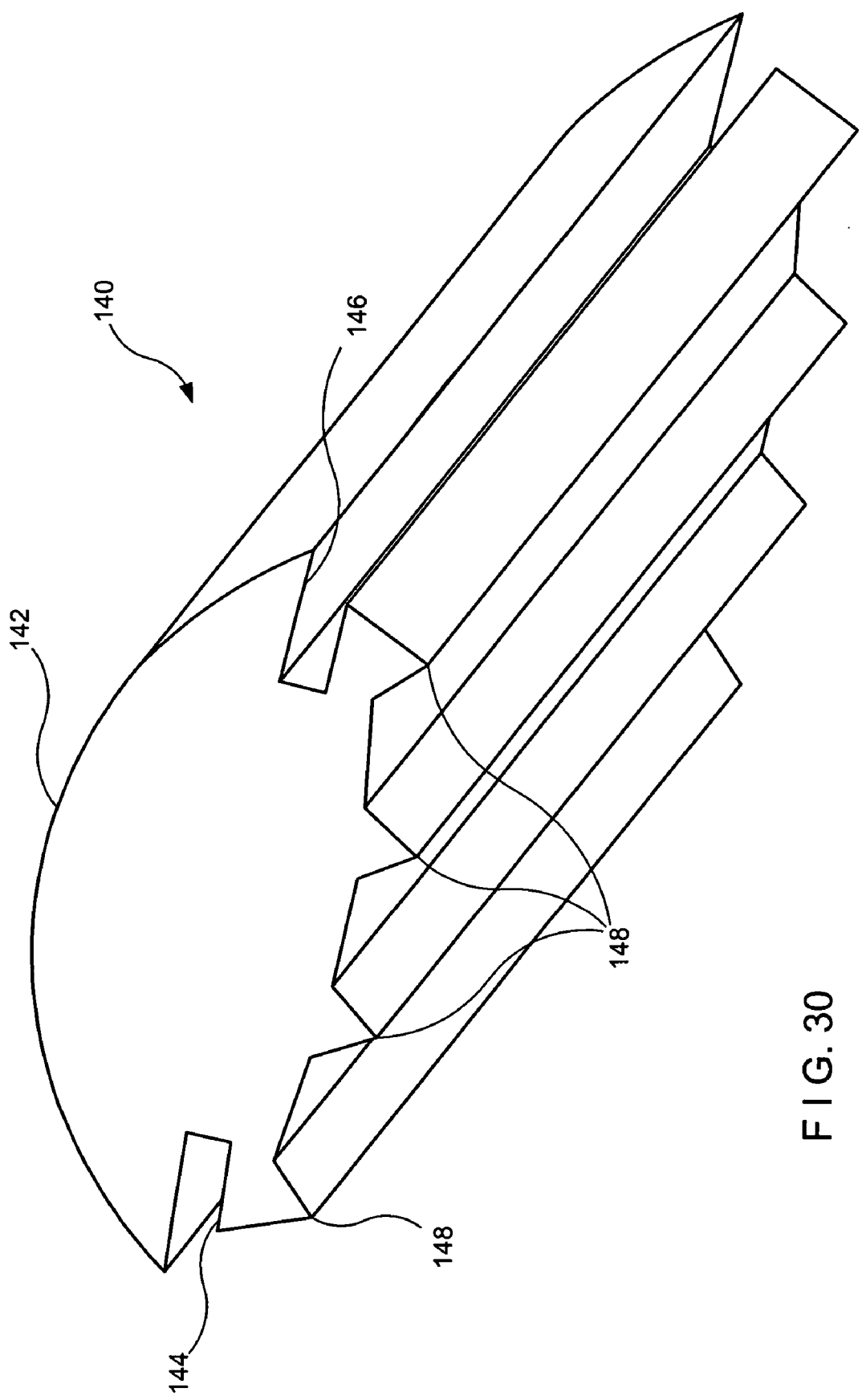
FIG. 30 is a first perspective view of the extruded finned pin of the present invention.
Figure 31:
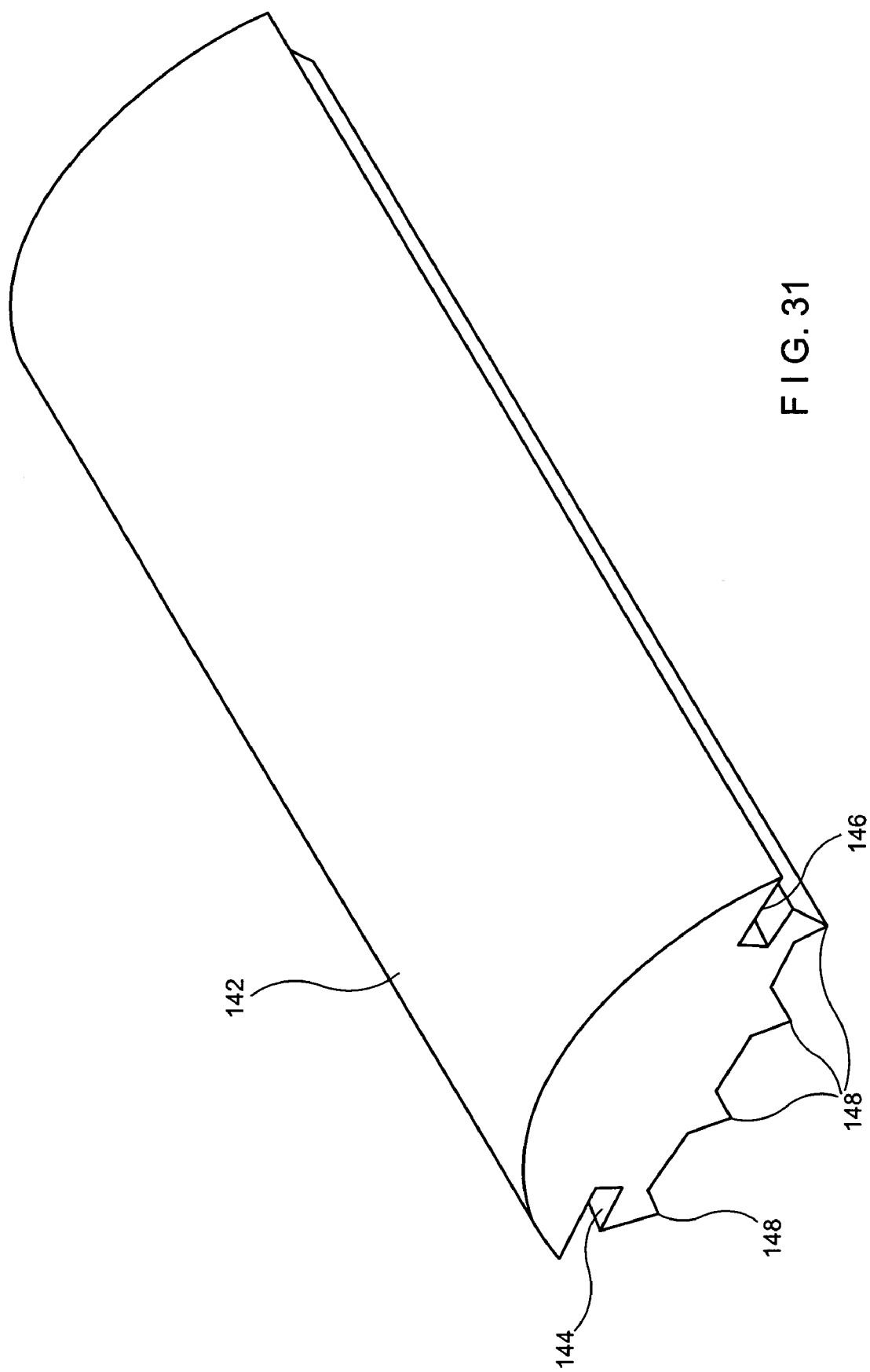
FIG. 31 is a second perspective view of the extruded finned pin of the present invention.

The extruded finned pins 140 are shown in detail in FIGS. 30 and 31. The cross-section of extruded finned pins 140 includes a rounded outward section 142, slots 144, 146 which are formed at opposed ends of rounded outward section 142, and inwardly extending fins 148.

Figure 24:
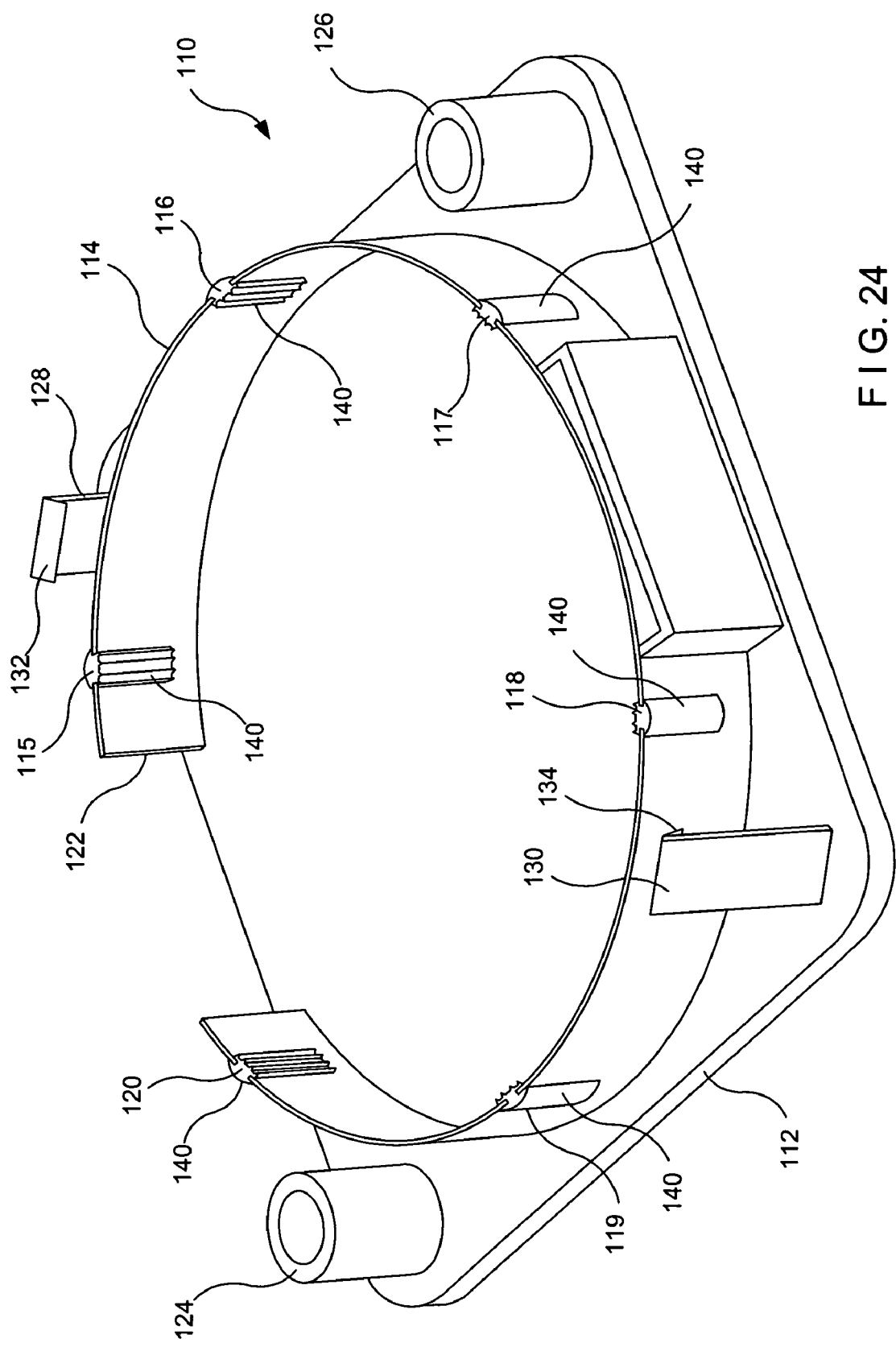
FIG. 24 is a perspective view of the base of the seventh embodiment of the semiconductor wafer containment device of the present invention, shown with the extruded finned pins inserted throughout the periphery thereof.
Figure 25:
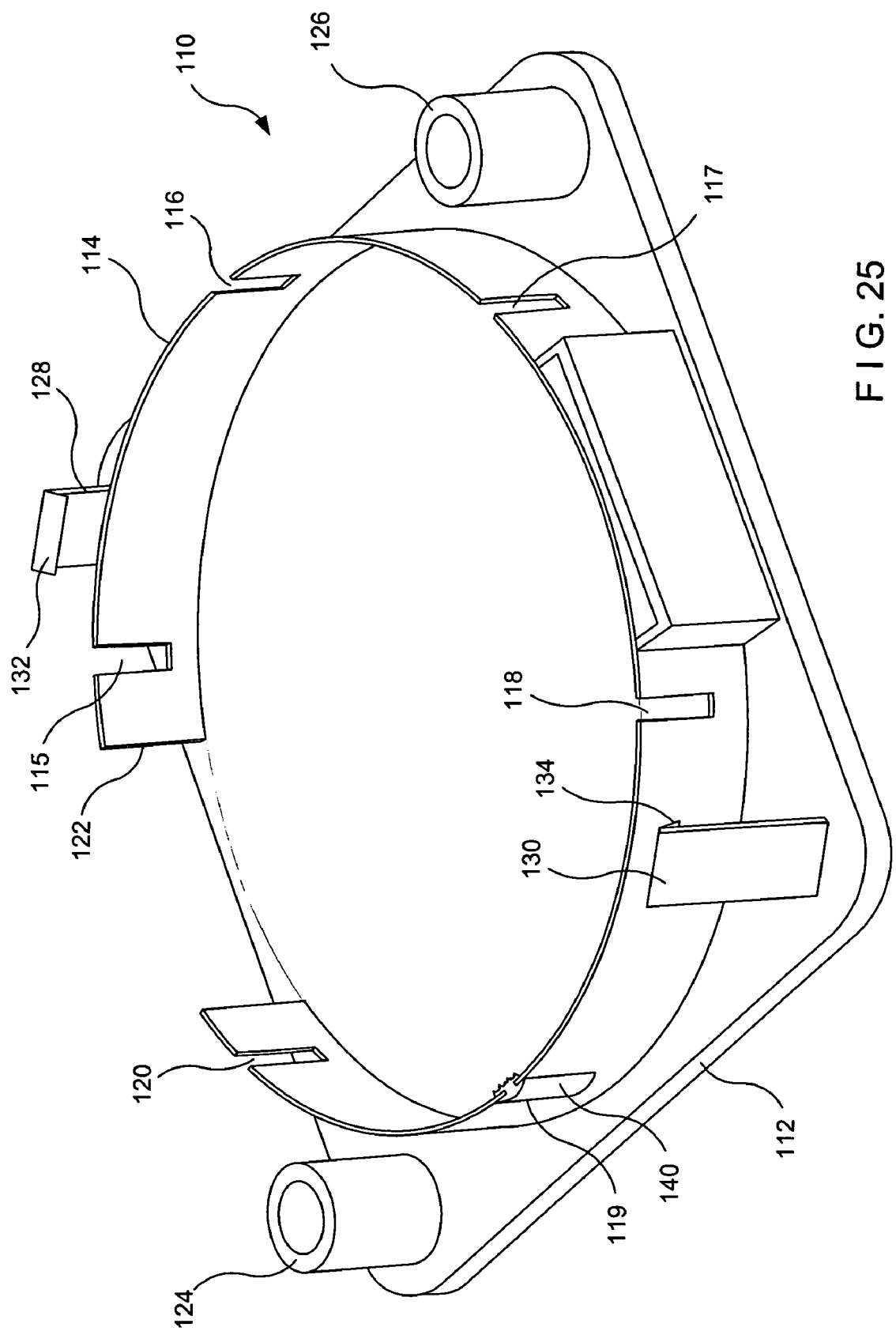
FIG. 25 is a perspective view of the base of the seventh embodiment of the semiconductor wafer containment device of the present invention, shown with a single extruded finned pin inserted at a location on the periphery thereof.
Figure 26:
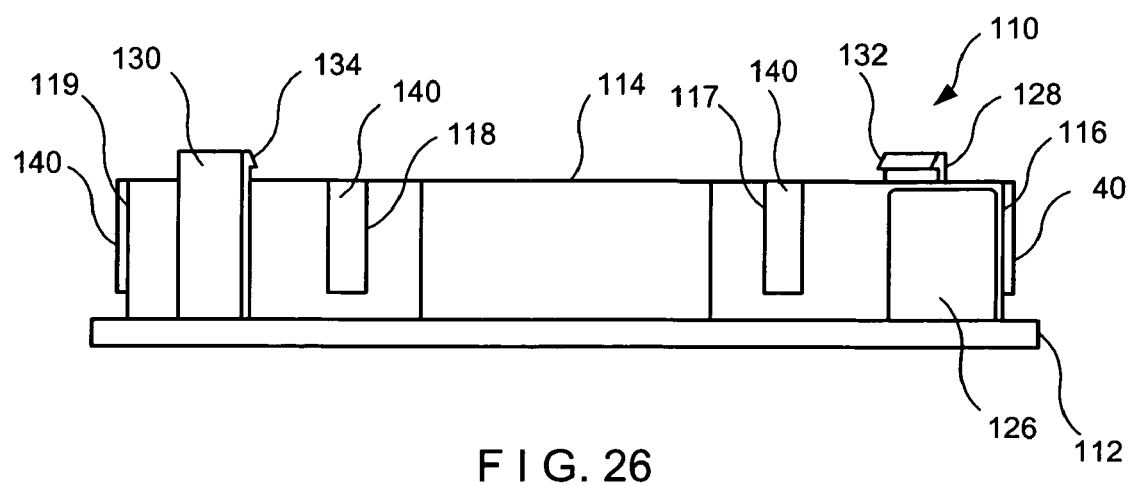
FIG. 26 is a first side plan view of the base of the seventh embodiment of the semiconductor wafer containment device of the present invention, shown with the extruded finned pins inserted.
Figure 27:
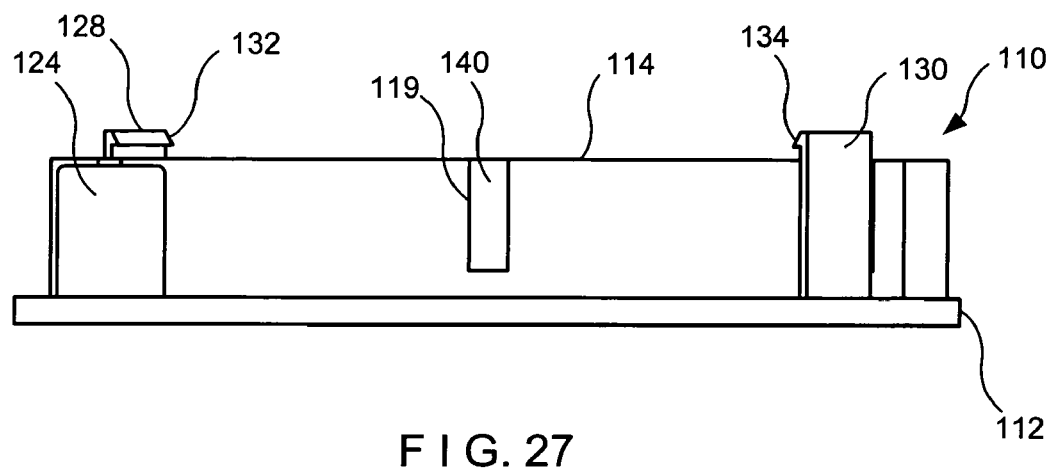
FIG. 27 is a second side plan view of the base of the seventh embodiment of the semiconductor wafer containment device of the present invention, shown with the extruded finned pins inserted.
Figure 28:
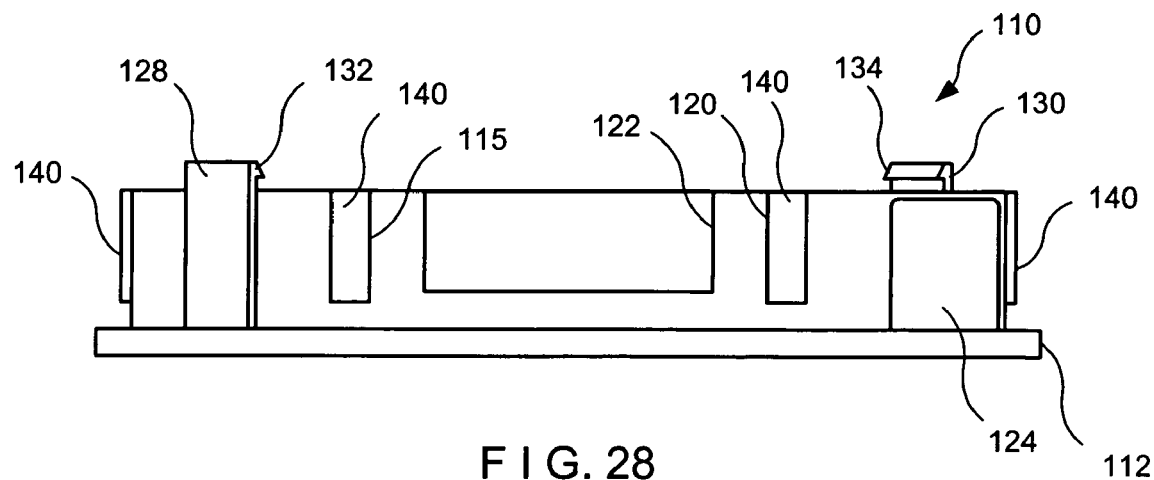
FIG. 28 is a third side plan view of the base of the seventh embodiment of the semiconductor wafer containment device of the present invention, shown with the extruded finned pins inserted.

As shown in FIG. 24, extruded finned pins 140 are inserted into slots 115, 116, 117, 118, 119, 120 of cylindrical wall 114, typically after circular semiconductor wafers (not shown) are loaded within cylindrical wall 114 with some amount of clearance between the circular semiconductor wafers and cylindrical wall 114. Slots 144, 146 of extruded finned pins 140 capture the edges of cylindrical wall 114 which form slots 115, 116, 117, 118, 119, 120. The inwardly extending fins 148 of extend into the space within cylindrical wall 114 so as to engage the circular semiconductor wafers. FIG. 24 shows extruded finned pins 140 inserted into each slot 115, 116, 117, 118, 119, 120 about the periphery of cylindrical wall 114. However, some applications may use extrded finned pins 140 about only half of the periphery of cylindrical wall 114. Similarly, some embodiments of the base 112 may include slots around only a portion of cylindrical wall 114.

Extruded finned pins 140 need to be thin and soft to cushion the semiconductor wafers (not shown) but firm enough to prevent movement as fins 148 act like a spring gently pushing on the stack of semiconductor wafers. A typical material for the extruded finned pins 140 would be Kraton but one skilled in the art would recognize a range of equivalent materials after study of this disclosure.

Prior to unloading the semiconductor wafers, a lid 70 (such as that disclosed in FIGS. 7–11) and extruded finned pins 140 are removed.

Thus the several aforementioned objects and advantages are most effectively attained. Although preferred embodiments of the invention have been disclosed and described in detail herein, it should be understood that this invention is in no sense limited thereby and its scope is to be determined by that of the appended claims.

What is claimed is:

1. A containment device for retaining semiconductor wafers, comprising:
  a base including at least one cylindrical wall extending therefrom, said at least one cylindrical wall forming a wafer containment area therewithin, at least a portion of said at least one cylindrical wall being segmented thereby forming slots within said at least one cylindrical wall, said slots receiving spacer elements which extend into said wafer containment area thereby positioning a plurality of semiconductor wafers away from said at least one cylindrical wall;
  said spacer elements comprising a flexible material, whereby said spacer elements can be installed after a plurality of semiconductor wafers have been placed in said wafer containment area and further whereby said spacer elements can be removed prior to removal of the plurality of semiconductor wafers; and
  a lid which includes means for engaging said base, said lid forming a top of the containment device when said base and said lid are attached together.

2. The containment device for retaining semiconductor wafers of claim 1 wherein said at least one cylindrical wall extends perpendicularly from said base.

3. The containment device for retaining semiconductor wafers of claim 1 wherein said means for engaging said base includes slots which receive prongs which are formed on said base.

4. The containment device for retaining semiconductor wafers of claim 1 wherein said lid includes a lid cylindrical wall which, when said base and said lid are attached together, fits immediately outwardly adjacent from said at least one cylindrical wall of said base.

5. The containment device for retaining semiconductor wafers of claim 1 wherein said slots are formed periodically around said at least one cylindrical wall.

6. The containment device for retaining semiconductor wafers of claim 1 wherein said at least one cylindrical wall includes at least one gap which is larger than said slots.

7. A containment device for retaining semiconductor wafers, comprising:
  a base including at least one cylindrical wall extending therefrom, said at least one cylindrical wall forming a wafer containment area therewithin, at least a portion of said at least one cylindrical wall being segmented thereby forming slots within said at least one cylindrical wall, said slots receiving spacer elements which extend into said wafer containment area;
  a lid which includes means for engaging said base, said lid forming a top of the containment device when said base and said lid are attached together; and said spacer elements including grooves which capture edges of said at least one cylindrical wall which form said slots and further including fins which extend into said wafer containment area.

8. The containment device for retaining semiconductor wafers of claim 7 wherein said spacer elements are formed by extrusion.

9. The containment device for retaining semiconductor wafers of claim 8 wherein said spacer elements are sufficiently soft to form a cushion for semiconductor wafers in said wafer containment area.

10. The containment device for retaining semiconductor wafers of claim 1 further including arcuate shielding walls formed around said slots in said at least one cylindrical wall.

11. A containment device for retaining semiconductor wafers, comprising:
   a base including an inner concentric cylindrical wall and an outer concentric cylindrical wall extending therefrom, said inner concentric cylindrical wall forming a wafer containment area therewithin, at least a portion of said inner and outer concentric cylindrical walls being segmented thereby forming slots within said inner and outer concentric cylindrical walls, said slots receiving spacer elements which extend into said wafer containment area thereby positioning a plurality of semiconductor wafers away from said inner concentric cylindrical wall;
   said spacer elements comprising a flexible material, whereby said spacer elements can be installed after a plurality of semiconductor wafers have been placed in said wafer containment area and further whereby said spacer elements can be removed prior to removal of the plurality of semiconductor wafers; and
   a lid which includes means for engaging said base, said lid forming a top of the containment device when said base and said lid are attached together.

12. The containment device for retaining semiconductor wafers of claim 11 wherein said inner and outer concentric cylindrical walls extend perpendicularly from said base.

13. The containment device for retaining semiconductor wafers of claim 11 wherein said means for engaging said base includes slots which receive prongs which are formed on said base.

14. The containment device for retaining semiconductor wafers of claim 11 wherein said lid includes a lid cylindrical wall which, when said base and said lid are attached together, fits immediately outwardly adjacent from said outer concentric cylindrical wall of said base.

15. The containment device for retaining semiconductor wafers of claim 11 wherein said slots are formed periodically around said inner and outer concentric cylindrical walls.

16. The containment device for retaining semiconductor wafers of claim 11 wherein said inner and outer concentric cylindrical walls include at least one gap which is larger than said slots.

17. A containment device for retaining semiconductor wafers, comprising:
   a base including an inner concentric cylindrical wall and an outer concentric cylindrical wall extending therefrom, said inner concentric cylindrical wall forming a wafer containment area therewithin, at least a portion of said inner and outer concentric cylindrical walls being segmented thereby forming slots within said inner and outer concentric cylindrical walls, said slots receiving spacer elements which extend into said wafer containment area and include a cylindrical head and tail extending and therefrom; and
   a lid which includes means for engaging said base, said lid forming a top of the containment device when said base and said lid are attached together.

18. The containment device for retaining semiconductor wafers of claim 17 wherein said tail includes teeth extending therefrom.

19. The containment device for retaining semiconductor wafers of claim 18 wherein said spacer elements are sufficiently soft to form a cushion for semiconductor wafers in said wafer containment area.

20. The containment device for retaining semiconductor wafers of claim 17 wherein said cylindrical head is sufficiently large to prevent said cylindrical head from passing through said slots.

* * * * *